United States Patent [19]

Hynecek

[11] Patent Number: 5,151,380
[45] Date of Patent: Sep. 29, 1992

[54] METHOD OF MAKING TOP BUSS VIRTUAL PHASE FRAME INTERLINE TRANSFER CCD IMAGE SENSOR

[75] Inventor: Jaroslav Hynecek, Richardson, Tex.
[73] Assignee: Texas Instruments Incorporated, Dallas, Tex.
[21] Appl. No.: 747,036
[22] Filed: Aug. 19, 1991
[51] Int. Cl.⁵ .............................................. H01L 21/70
[52] U.S. Cl. ...................................... 437/53; 437/26; 437/50
[58] Field of Search ...................... 437/2, 3, 4, 26, 50, 437/53; 357/24; 365/183

[56] References Cited

U.S. PATENT DOCUMENTS

| | | | |
|---|---|---|---|
| 4,488,165 | 12/1984 | Levine | 357/24 |
| 4,642,877 | 2/1987 | Garner et al. | 437/56 |
| 4,660,090 | 4/1987 | Hynecek | 357/24 |
| 4,668,971 | 5/1987 | Hynecek | 357/24 M |
| 4,673,963 | 6/1987 | Hynecek | 357/24 M |
| 4,992,392 | 2/1991 | Nichols et al. | 437/53 |

Primary Examiner—Tom Thomas
Attorney, Agent, or Firm—Troy J. Cole; Richard A. Stoltz; Richard L. Donaldson

[57] ABSTRACT

In one embodiment of the invention, a method for fabricating a virtual phase image sensor is disclosed comprising the steps of forming a semiconductor substrate of a first conductivity type, forming a buried channel region of a second conductivity type in the substrate, forming a virtual gate of the first conductivity type at a surface of the buried channel region, implanting channel stop regions of the first conductivity type in the virtual gate, the channel stop regions contacting the buried channel, and forming a conductive contact on an upper surface of the channel stop regions wherein the conductive contact is additionally coupled to the substrate. In another embodiment of the invention, a method for fabricating a virtual phase image sensor is disclosed comprising the steps of forming a semiconductor substrate of a first conductivity type, forming a buried channel region of a second conductivity type, forming a gate insulator layer on the buried channel, selectively forming a conductive gate region on the gate insulator, depositing and patterning a masking layer on the conductive gate and the gate insulator such that a portion of an edge of the conductive gate and the gate insulator such that a portion of an edge of the at least one conductive gate is exposed by the masking layer pattern, and implanting a channel stop region of the first conductivity type in the buried channel in areas exposed by the masking layer pattern, whereby a side of the channel stop region is self-aligned to the portion of an edge of the conductive gate.

9 Claims, 12 Drawing Sheets

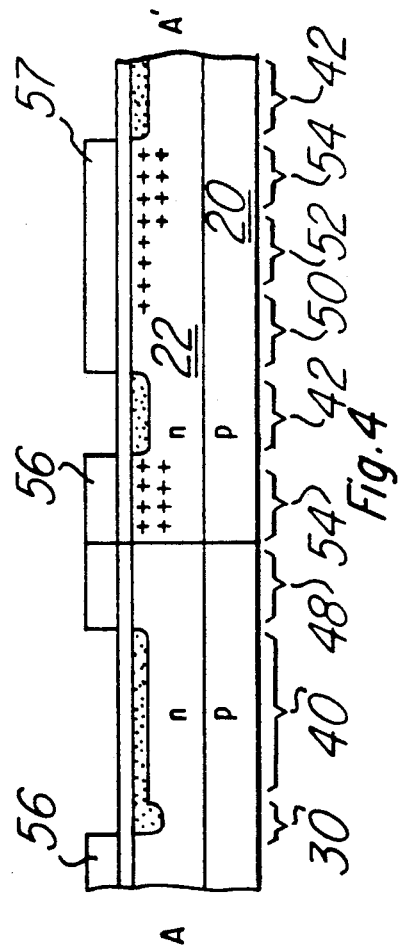
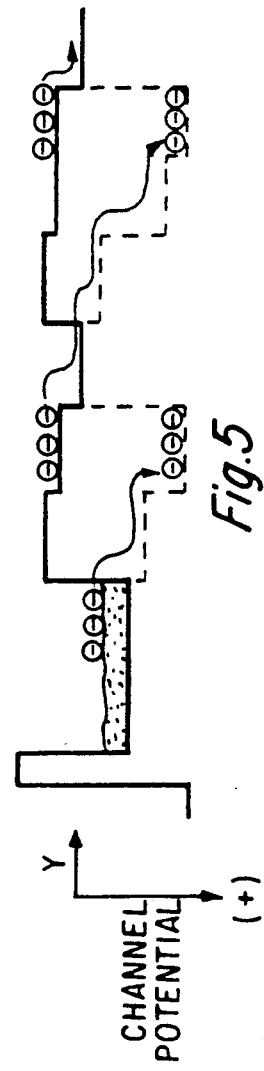
Fig.4
Fig.5

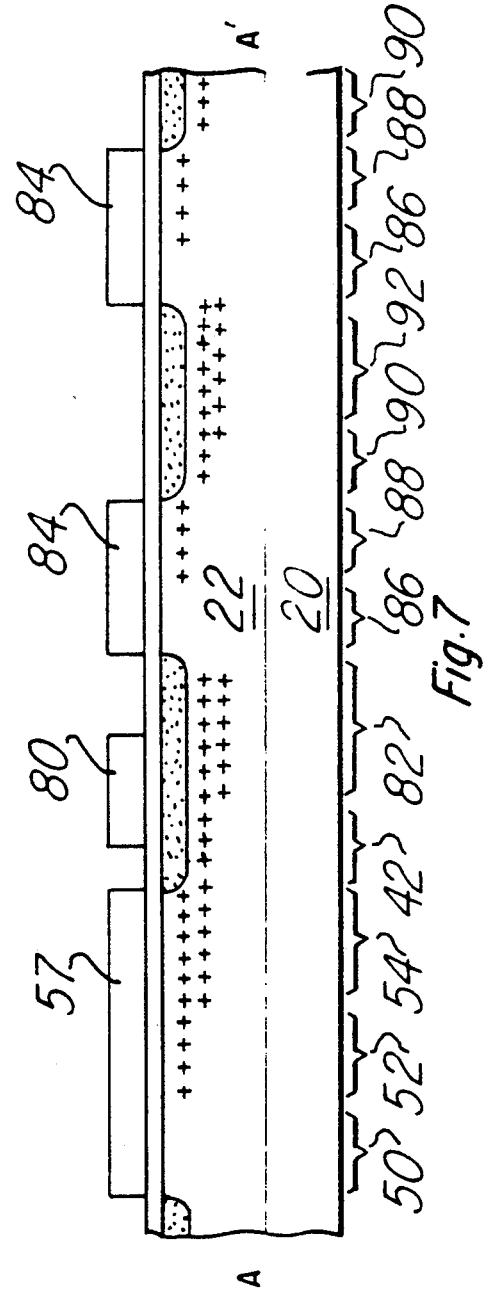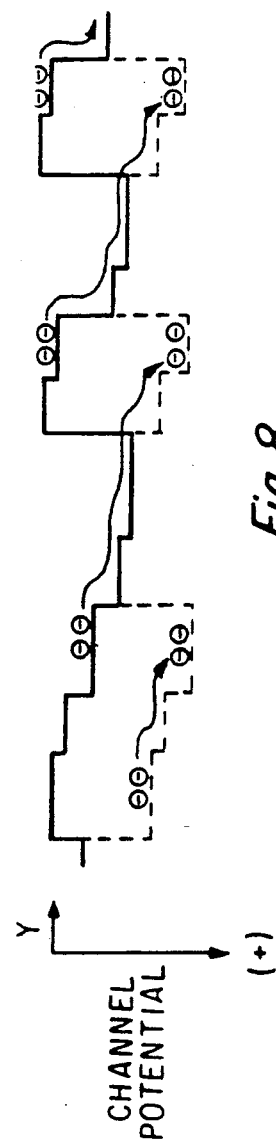
Fig.7
Fig.8

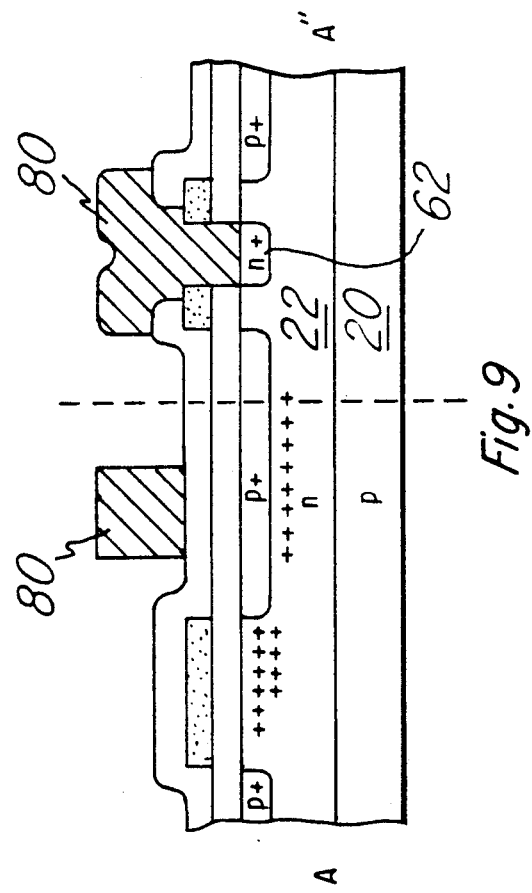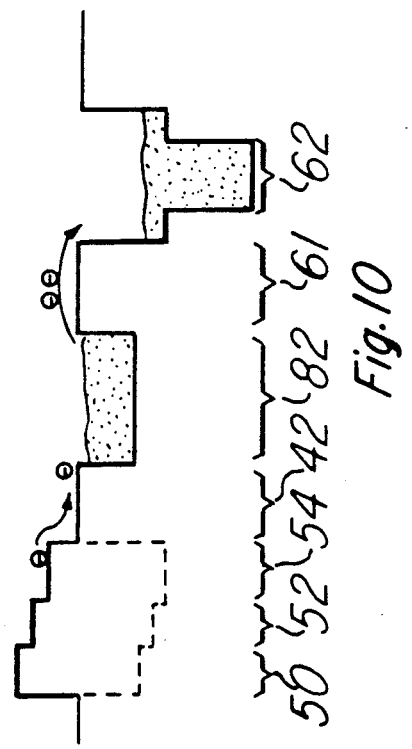

5,151,380

METHOD OF MAKING TOP BUSS VIRTUAL PHASE FRAME INTERLINE TRANSFER CCD IMAGE SENSOR

NOTICE (C) Copyright, *M* Texas Instruments Incoporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to virtual phase frame interline transfer CCD image sensors.

BACKGROUND OF THE INVENTION

Without limiting the scope of the invention, its background is described in connection with CCD imagers, as an example.

Heretofore, in this field, a CCD imager constructed according to well known techniques comprises a matrix of many cells, each responsive to visible light (or other wavelengths of radiation) for generating a number of electrons based upon the intensity of light impinging on the cells. The electrons collected within each cell of the matrix are then shifted to an output, and serialized, to produce an analog signal which corresponds to a portion of the image. The analog signals can then be amplified and re-transmitted to a CRT or other type of display, or recorded by a video tape recorder, for example.

CCD imagers are typically utilized in video cameras and other types of picture processing equipment to function as a transducer for converting visible images into corresponding electrical signals. CCD imagers adapted for such use are described in detail in U.S. Pat. No. 4,229,752, issued to the applicant and assigned to the same assignee as the present application, and incorporated herein by reference. The light energy reflected from an object is converted into an electrical image in the silicon material of the CCD integrated circuit. A CCD imager typically comprises a matrix of several thousand individual silicon cells which are exposed to the light reflected from the object. The photons which are characteristic of the reflected light enter the silicon cells and generate a number of electron-hole pairs in correspondence to the light intensity. Thus, for light rays having a high intensity, a larger number of electron-hole pairs will be generated than for light rays having a low intensity. Each cell of the CCD array is isolated from the adjacent cells so that the generated electrons within the cells remain associated with each respective cell. In this manner, an electrical image representative of the object image is thus captured. The substrate of the silicon CCD imager is biased to remove the holes of the electron-hole pairs, thereby leaving the captured electrons as the charge which is representative of the obejct image.

The isolation which typically separates the CCD cells is illustrated in FIG. 1. It comprises a boron diffusion 10 which extends down through the buried channel 12 and contacts the substrate 14 in order to provide lateral isolation between the cells as well as a path for carriers from the p+ virtual gate region 16 to flow to the p-type substrate 14. The requirement in virtual phase CCD imagers that the channel stops 10 reach down to the substrate 14 result in an isolation structure that requires a large amount of the image sensor's surface area, since the channel stop diffusion spreads laterally as well as vertically. Such deep isolation implants are therefore counterproductive with regard to attempts to increase the packing density or increase the number of CCD cells per chip (i.e. higher resolution).

From the foregoing, it can be seen that a need exists for a channel stop isolation scheme for CCD image sensors that will provide adequate lateral isolation between adjacent cells and also provide a path for charge carriers to travel from the virtual gate electrode to the substrate, while occupying a minimum amount of the cell's surface area.

SUMMARY OF THE INVENTION

It is herein recognized that a need for a virtual phase CCD image sensor with high density integration. The present invention is directed towards meeting those needs.

Generally, and in one form of the invention, a virtual phase image sensor is disclosed wherein majority carriers are supplied to a virtual gate by a conductor overlying the image sensor, the virtual gate and the conductor each in contact with a conductive channel stop region.

In another form of the invention, a virtual phase image sensor is disclosed, comprising a semiconductor substrate of a first conductivity type, a buried channel of a second conductivity type disposed on the substrate a virtual gate of the first conductivity type disposed on the buried channel, at least one channel stop region of the second conductivity type extending from a surface of the virtual gate and into the buried channel, and at least one conductor contacting a surface of the at least one channel stop, the conductor also contacting the substrate in order to supply majority carriers between the substrate and the virtual gate.

In yet another form of the invention, a dual gate virtual phase charge coupled device (CCD) is dislcosed, comprising a first clocked gate electrode, a first clocked barrier region disposed in a semiconductor layer beneath the first clocked gate electrode, a first clocked well region disposed in the semiconductor layer beneath the first clocked gate electrode and adjoining the first clocked barrier, a virtual barrier region in the semiconductor layer adjoining the first clocked well region, a second clocked gate electrode disposed on the semiconductor layer, a second clocked barrier region disposed in the semiconductor layer beneath the second clocked gate electrode and adjoining the virtual barrier region, a second clocked well region disposed in the semiconductor layer beneath the second clocked gate electrode and adjoining the second clocked barrier region, whereby charge stored in the first clocked well region while a first bias is applied to the first clocked gate, electrode, and said charge is transferred into the second clocked well region when a second high bias is applied to the second clocked gate electrode and the first high bias is removed from the first clocked gate electrode.

In still another form of the invention, a frame transfer charge coupled device (CCD) image sensor having at least one antiblooming drain structure disposed between at least one image array colummn and at least one memory register column is disclosed, each of the at least one antiblooming drain structure comprising a first virtual barrier region disposed in a semiconductor layer and adjoining the at least one image array column, a virtual well region disposed in the semiconductor layer and adjoining the virtual barrier region and the at least one memory register column, a drain region disposed in the semiconductor layer for sinking charge flowing into the drain region, and a second virtual barrier disposed in the semiconductor layer between the virtual well region and the drain region, whereby charge in the virtual well region overflows into the drain region when flow of charge into the at least one memory register column is impeded.

In another form of the invention, a frame interline transfer (FIT) charge coupled device (CCD) image sensor is disclosed comprising a virtual phase image sensing array wherein majority carriers are supplied to a virtual gate by a conductor overlying the image sensing array, the virtual gate and the conductor each being in contact with a conductive channel stop region, a field memory, a plurality of antiblooming drains coupled between image sensing array and the field memory, a serial register coupled to the filed memory, the serial register having a parallel input, a serial output, and a parallel output, and a charge clearing drain coupled to the parallel output of the serial register.

In still another form of the invention, a method for fabricating a virtual phase image sensor is disclosed comprising the steps of forming a semiconductor substrate of a first conductivity type, forming a buried channel region of a second conductivity type in the substrate, forming a virtual gate of the first conductivity type at a surface of the buried channel region, implanting at least one channel stop region of the first conductivity type in the virtual gate, the at least one channel stop region contacting the buried channel, and forming at least one conductive contact on an upper surface of the at least one channel stop wherein the at least one conductive contact is additionally coupled to the substrate.

In another form of the invention, a method for fabricating a virtual phase image sensor is disclosed comprising the steps of forming a semiconductor substrate of a first conductivity type, forming a buried channel region of a second conductivity type, forming a gate insulator layer on the buried channel, selectively forming at least one conductive gate region on the gate insulator, depositing and patterning a masking layer on the at least one conductive gate and the insulator such that a portion of an edge of the at least one conductive gate is exposed by the masking layer pattern, and implanting at least one channel stop region of the first conductivity type in the buried channel in areas exposed by the masking layer pattern, whereby at least one side of the at least one channel stop region is self-aligned to the portion of an edge of the at least one conductive gate.

An advantage of the invention is that it allows for denser integration of CCD image sensor arrays.

BRIEF DESCRIPTION OF THE DRAWINGS

The foregoing and further aspects of the invention are illustrated in the accompanying drawings wherein like elements are denoted by like reference designators and in which:

FIG. 2a-e is a cross-sectional view of the fabrication steps of a first and second preferred embodiments of the present invention;

FIG. 4 is a cross-sectional view taken along the axis A—A' of FIG. 3;

FIG. 5 is a channel potential diagram corresponding to the section of FIG. 4;

FIG. 7 is a cross-sectional view taken along axis A—A' of FIG. 6;

FIG. 8 is a channel potential diagram corresponding to the section of FIG. 7;

FIG. 9 is a cross-sectional view taken along axis A—A' of FIG. 6;

FIG. 10 is a channel potential diagram corresponding to the section of FIG. 9;

DETAILED DESCRIPTION OF PREFERRED EMBODIMENTS

Figure 2C:
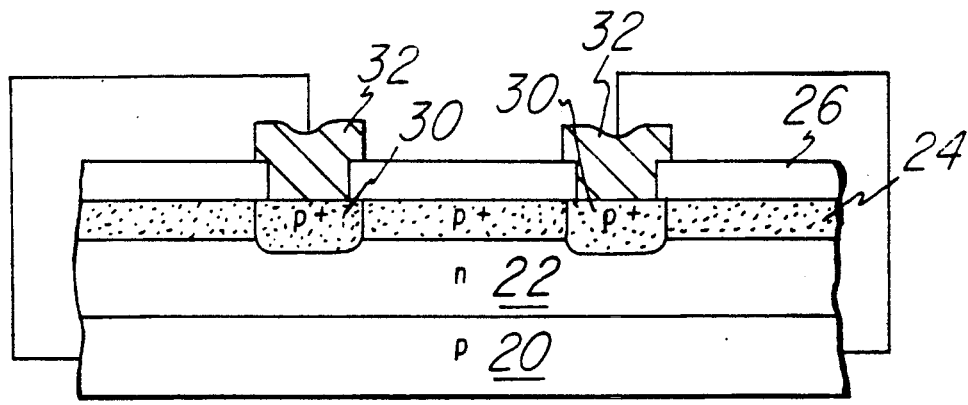

A first preferred embodiment fabrication method of the present invention is illustrated in FIG. 2a-c. Note that dimensions in all drawings herein have been enlarged or reduced to emphasize particular features of the structures.

In FIG. 2a, a substrate 20 is provided of silicon, for example, which has been doped to be p-typed to a concentration of approximately $1-5 \times 10^{15}$ atoms/cm$^3$. An n-type buried channel layer 22 is formed on substrate 20 and is composed also of silicon, for example, and doped to approximately $1-8 \times 10^{16}$ atoms/cm$^3$. Layer formation may be accomplished with any of several methods well known in the art, such as single impurity diffusion, epitaxial metal organic chemical vapor deposition (MOCVD), etc. Upon buried layer 22 is then formed a layer 24 which will later form the virtual gate of the CCD cell. Virtual gate layer 24 is doped to be p+ to a connection of approximately $1-8 \times 10^{17}$ atoms/cm$^3$. A gate oxide layer 26 is grown on the wafer before the implant of the p+ virtual gate 24. The layer 26 is formed so as to transmit light energy therethrough. A photoresist layer 28 is next spun onto the wafer and patterned to define the locations of channel stop regions. Ion implantation of boron is applied through the openings in layer 28 to a concentration of approximately $1-8 \times 10^{18}$ atoms-cm$^3$, resulting in shallow p+ channel stop regions 30. Photoresist layer 28 is then stripped from the wafer and a second photoresist layer (not shown) is deposited and patterned to define the locations of contact holes to the channel stop regions 30. A buffered HF acid etch is then used to remove the portions of oxide layer 26 down to channel stop regions 30 in all areas exposed by the photoresist. After this etch, the photoresist is stripped from the wafer, resulting in the structure of FIG. 2b.

In FIG. 2c, a layer 32 of aluminum contact metal is deposited onto the entire wafer and makes contact with channel stop regions 30 through the openings in gate oxide layer 26. Another layer of photoresist (not shown) is deposited and patterned on the wafer to cover only those regions where a conductive contact is to remain. A suitable etch is then used to etch the exposed metal 32, after which the resist is stripped, leaving the final top buss 32 structure of FIG. 2c. The top buss 32 makes contact with the substrate 20 at the periphery of the device, as shown schematically in the figure.

Figure 2D:
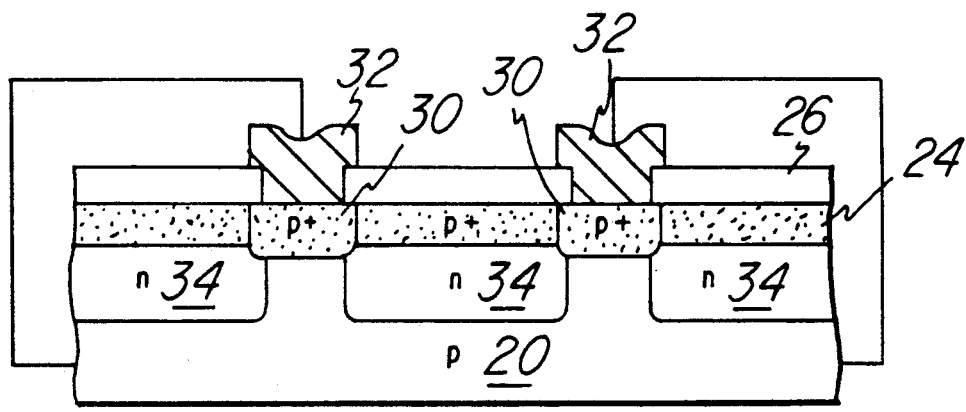

FIG. 2d shows an alternative configuration in which the buried channel of the device is formed by a series of patterned n-type implants 34 which are formed at the same point in processing as the buried channel 22 of the device in FIG. 2a.

In the first preferred embodiment of the present invention, the p+ channel stop region 30 does not reach through the n-type buried channel 22 to the substrate 20. Because of this, it can be made much shallower and therefore much narrower than was previously possible with prior art designs. This results in less of the image sensor surface area being devoted to the channel stop regions, allowing for larger photosite wells (i.e. increased sensitivity) or a more densely packed array with the same size photosites (i.e. smaller die size).

The doping of the p+ channel stop regions 30 must satisfy two criteria. First, the doping only needs to be heavy enough to change the potential profile of the n-type buried channel layer 22 below, thus providing good lateral separation between adjacent wells. Secondly, the doping also needs to be sufficiently heavy to obtain a good ohmic contact with the top buss 32. It will be readily appreciated by those skilled in the art that the top buss 32 may be made of any reasonable conductive material, such as aluminum, tungsten, tungsten silicide, etc. It is only necessary to provide a supply of holes to the virtual gate electrode.

In many existing image sensor device designs, there is already metal present on the top surface of the cell which can be converted to use as a top buss connection to the channel stop. For example, in the standard interline architecture, there is already a metal light shield in place over the channel. In the standard frame transfer architecture, there is a metal light shield in place over the memory section of the device. It can be clearly seen, then, that using a top buss contact to the channel stop in either of these architectures does not cause any device performance degradation. In the frame transfer image sensing area, the quantum efficiency would be somewhat reduced, but a better pixel separation would be obtained. This is advantageous in color sensing applications where it substantially eliminates the color crosstalk, and therefore is a worthwhile tradeoff.

Figure 2E:
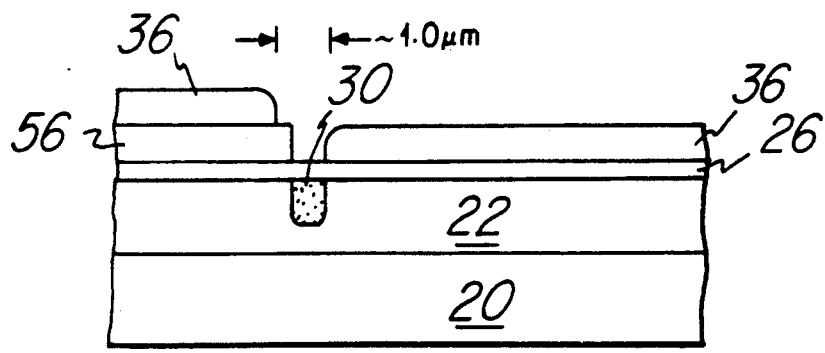

A variation of the above process will allow for submicron geometries with the use of a partially self aligned channel stop is shown as a second preferred embodiment in FIG. 2e. Because one side of the channel stop 30 is self-aligned with the edge of the polysilicon gate 56 (gate 56 is described in relation to FIG. 3), photoresist 36, which has a minimum pattern resolution of approximately 1 micron, can be used to define a channel stop 30 with a width of approximately 0.5 micron. This is due to the fact that the horizontal placement accuracy of the photoresist pattern is on the order of 0.25 micron. By overlapping the photoresist 36 pattern opening with the edge of the polysilicon gate 56, channel stop 30 is not only of minimum size, but is perfectly aligned with the edge of the gate 56 as well. The actual creation of region 30 is as described in relation to FIG. 2a.

Figure 3:
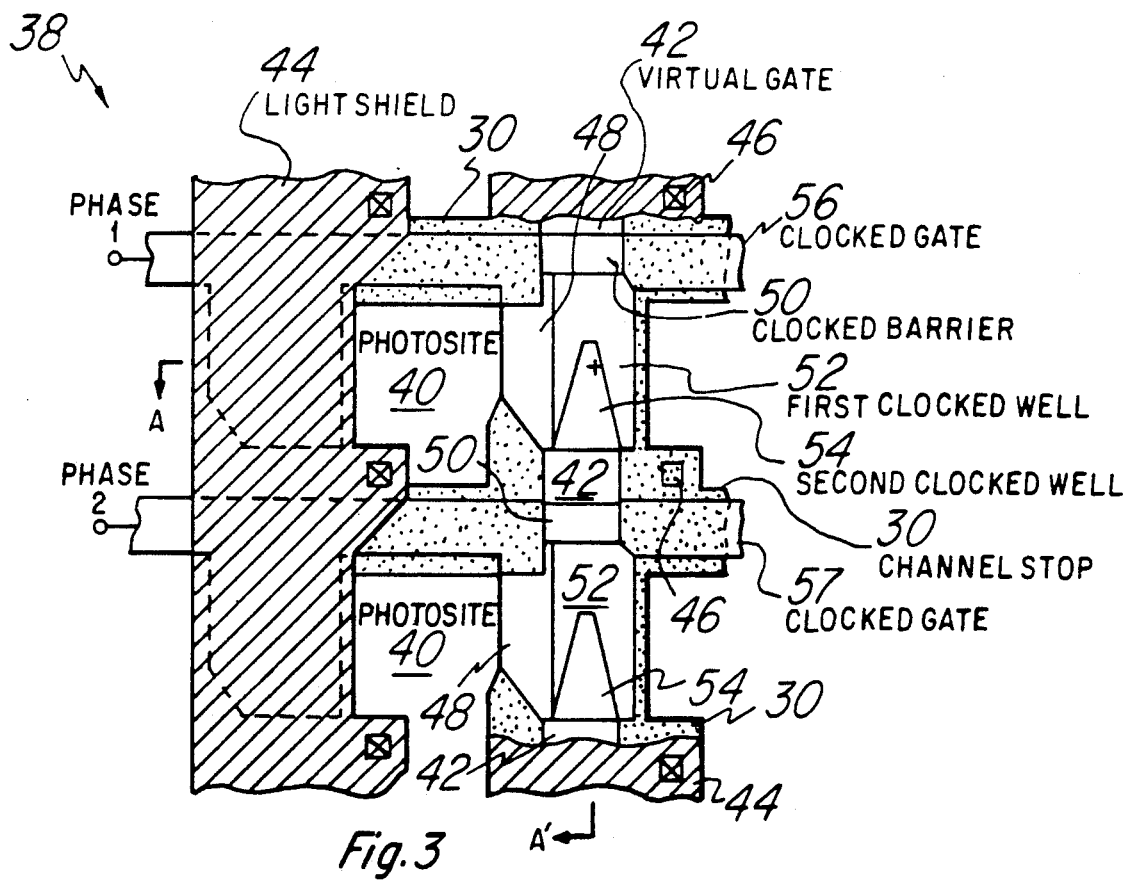
FIG. 3 is a plan view of a portion of the image sensing area of an image sensor array incorporating the present invention.

FIG. 3 shows a plan view of a portion of the image sensing area 38 of a Frame Interline Transfer (FIT) CCD image sensor array 38 which incorporates the first preferred embodiment of the present invention. Photosite regions 40 are p+ regions formed at the same time as the p+ virtual gate electrode 42. The photosite 40 is isolated on three sides by p+ channel stop regions 30, which also conductively contact virtual gate 42 and a light shield 44. Portions of the channel stop 30 may be fabricated by the second preferred embodiment partially self-aligned method. The light shield 44 covers most of the image sensing area 38 except for photosites 40 and makes conductive contact with channel stop regions 30 in areas 46. The one side of the photosite 40 which is not adjoined by a channel stop region 30 is adjoined by clocked transfer barrier 48. The clocked portion of the vertical CCD channel is comprised of clocked barrier 50, first clocked well 52 and second clocked well 54. Overlying the clocked transfer barrier 48, clocked barrier 50, first clocked well 52 and second clocked well 54 is a polysilicon clocked gate. The clocked gates are formed in pairs down the vertical CCD channel, alternating between a phase 1 clocked gate 56 and a phase 2 clocked gate 57. The operation of the two phase clocked gates 56 and 57 will be explained hereinbelow. First and second clocked wells 52 and 54 are formed using two implants. The first implant, which is doped to approximately $1-8 \times 10^{17}$ atoms/cm$^3$, covers the largest possible area (the complete area of both clocked wells) in order to achieve the largest possible well capacity. The second implant, which is doped by addition of approximately $2 \times 10^{17}$ atoms/cm$^3$, defines the area of the second clocked well 54 and is substantially wedge shaped in order to achieve a high charge transfer efficiency (CTE). The wedge shaped second clocked well 54 creates suitable lateral fields which aid the vertical charge transfer speed. The actual construction of the device 38 of FIG. 3 may be accomplished by any of a number of standard semiconductor processing techniques well known to those skilled in the art. The operation of this image sensing area 38 will be described hereinbelow.

FIG. 4 is a cross-sectional view of the image sensing area 38 of FIG. 3 taken along the axis A—A', while FIG. 5 is a corresponding channel potential diagram of the same cross-section. Charge is integrated in the photosite 40 during a predetermined integration time and is trapped in the photosite 40 well by the channel stop 30 and the clocked transfer barrier 48. After the predetermined integration time, the accumulated charge is moved into the vertical CCD channel by applying a high level bias to the phase 1 clocked gate 56, which increases the channel potential of the regions under clocked transfer barrier 48 and first and second clocked wells 52 and 54 as shown by the dashed line in these regions in FIG. 5 (because of the choice of cross-sectional axis, the first clocked well 52 in the phase 1 of the CCD channel is not visible in the channel potential diagram of FIG. 5). Charge previously trapped in the photosite 40 is now attracted to the area of maximum channel potential, i.e. the second clocked well 54 of phase 1. At this point, the charge cannot travel any further down the channel because of the lower channel potential under the virtual gate barrier 42. The phase 1 clocked gate 56 is then brought to a lower potential, which lowers the channel potential profile under the phase 1 clocked gate 56 to the solid line of FIG. 5. At approximately the same time, the phase 2 clocked gate 57 is brought to a higher potential, which increases the channel potential under the phase 2 clocked gate 57 to the dashed line indicated in FIG. 5. The net effect is that the charge is now able to flow over the virtual gate barrier 42, through the phase 2 clocked barrier 50, phase 2 first clocked well 52 and finally into the phase 2 second clocked well 54, where it is prevented from further travel down the channel by another virtual gate barrier 42. The above cycle is repeated until the charge has been transfered all the way down the vertical CCD channel. It will be appreciated by those skilled in the art that the phase 1 and phase 2 clocks are overlapping pulses of substantially opposite phase, though not necessarily of 50% duty cycle.

The image sensing area 38 of FIG. 3 incorporates the first preferred embodiment of the invention in the form of the light shield 44 placed over the vertical CCD register. The light shield 44 serves the dual role of blocking incident radiation from the CCD channel and also as a substrate buss for supplying holes to the virtual gate 42 via interconnect regions 46. The virtual phase FIT architecture illustrated by way of example thus needs only a single layer of metal, which is one of several important processing advantages in reducing the final cost of the sensor. Another important feature to note in the architecture of FIG. 3 is that the polysilicon gates 56 and 57 are separated only by a virtual barrier 42 with no virtual well. A third important feature is the design of the second clocked well 54 implant. The sloping sides of the region create lateral fields which increase the vertical charge transfer speed, and hence the charge transfer efficiency (CTE).

Figure 6:
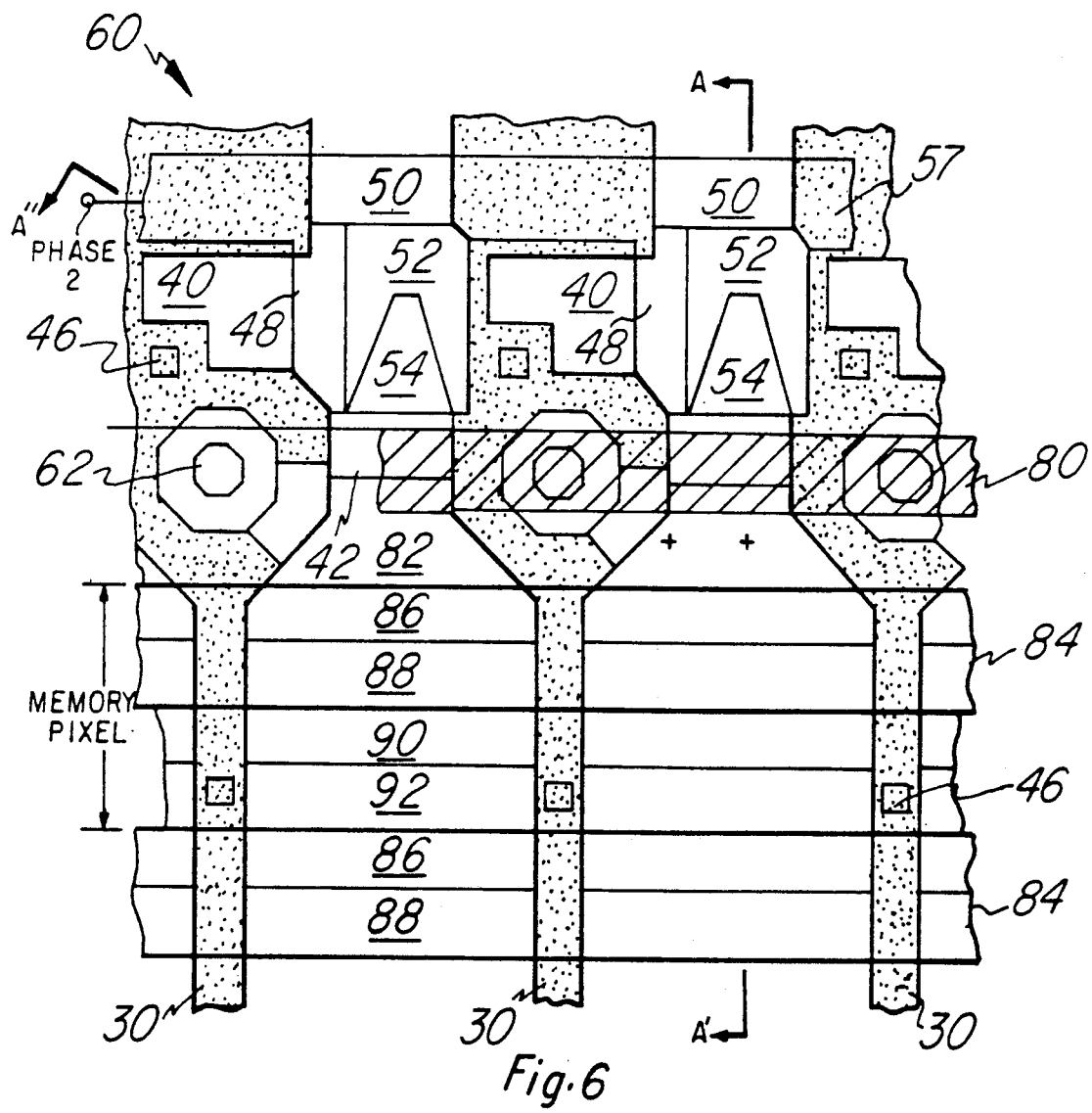
FIG. 6 is a plan view of a portion of the interface region between the image sensing area and the memory area of an image sensor array incorporating the present invention.

When utilizing the present invention in a CCD image sensor, antiblooming protection is not incorporated into each cell in order to reduce complexity and to increase quantum efficiency, rather it is incorporated at the base of each vertical CCD channel. A plan view of a typical antiblooming device is indicated generally at 60 in FIG. 6, illustrating the interface region between the image sensing area 38 of the sensor and the image field memory. The image memory area is interfaced with the image sensing area 38 using a special cell which has a gated n+ drain incorporated into it. The drain cell allows the charge to flow into the memory without loss if the memory clocked gate 84 is biased high. If the memory clocked gate 84 is biased low, charge flowing from the image area 38 will automatically overflow into the n+ drain region 62. The cell thus serves as a lateral overflow drain for the entire vertical CCD column. During the charge integration time (every horizontal blanking interval), the vertical CCD is clocked through several pulses to cause the charge in the channel to transfer into the virtual well region 82 at the interface between the image area and the memory area. During this time, the memory gate 84 is biased negative so that the signal charge cannot enter the memory pixels. One memory pixel is made up of a clocked barrier 86, a clocked well 88, a virtual barrier 90 and a virtual well 92. Each pixel is isolated in the horizontal direction by channel stops 30 which are conductively connected to the light shield 44 (not shown) as detailed in the first preferred embodiment of the present invention. The memory pixel operates after the fashion of a standard virtual phase CCD (with two minor exceptions discussed hereinbelow) as is described in U.S. Pat. No. 4,229,752 issued to the applicant of the present case and assigned to the same assignee and incorporated herein by reference. The charge accumulates in the virtual well 82 and overflows virtual barrier 61 into the drain 62 since the well capacity of the virtual well 82 is less than the capacity of the storage well 88. During the normal charge transport to memory operation, the memory gates 84 are biased such that charge flows from the vertical CCD channel into memory through the virtual well 82 without accumulating in the virtual well 82, therefore there is no overflow of charge into the drain 62. It is only necessary to periodically clock the vertical CCD column to transport the spilled charge from the photosites 40 into the overflow drain 62. This may be conveniently accomplished during each horizontal blanking interval.

FIG. 7 illustrates the relative channel doping in a cross-section taken through A—A' of FIG. 6. A corresponding channel potential diagram for this section is illustrated in FIG. 8, illustrating the standard virtual phase clocking of the memory pixels.

FIG. 9 illustrates the relative channel doping and the drain 62 structure in a cross-section taken through A—A" of FIG. 6. A corresponding channel potential diagram for this section is illustrated in FIG. 10, illustrating the charge overflow from a full virtual well 82 into the drain 62. As noted above, the memory pixel geometry is very similar to a conventional virtual phase CCD cell with only two minor modifications. The first is related to the buried channel charge storage densities in the virtual regions 90 and 92 and the clocked regions 86 and 88. The charge storage densities have been optimized and are different for each region which necessitates the assignment of differing areas for the clocked wells 88 and the virtual wells 92.

The second difference is related to the substrate buss for the virtual gate as was detailed in the first preferred embodiment of the present invention. As explained above, in a conventional virtual phase CCD, the virtual gate 16 is connected to the substrate 14 of the device through the channel stops 10, as shown in prior art FIG. 1. This is accomplished by implanting the channel stop regions 10 with a high dose of p+ impurities followed by a diffusion or an anneal step. The problem associated with this approach, however, is that the high p+ impurity concentration and the deep implant cause a large lateral diffusion, which in turn takes up an undesirably large amount of valuable pixel area. The p+ channel stop 30 detailed in FIG. 6 is substantially narrower than the prior art channel stop and does not sacrifice as much of the pixel area as in the prior art device. Also, the depth of the p+ diffusion is now much shallower and does not actually penetrate the buried channel 22. The p+ channel stop 30 is, therefore, not directly connected to the p-type substrate 20 in the pixel area. The doping concentration and depth are optimized to provide only a sufficient potential barrier for the pixel separation in the horizontal direction without a direct path for holes to the substrate 20. Since the p+ region 30 is not connected to the substrate 20 in the pixel area, it is necessary to provide the ground connection to the virtual gate 42 by some other means. This is accomplished through the top metal bus 44 which here again serves the dual role as a memory light shield as in the image area 38 of the device.

Figure 11:
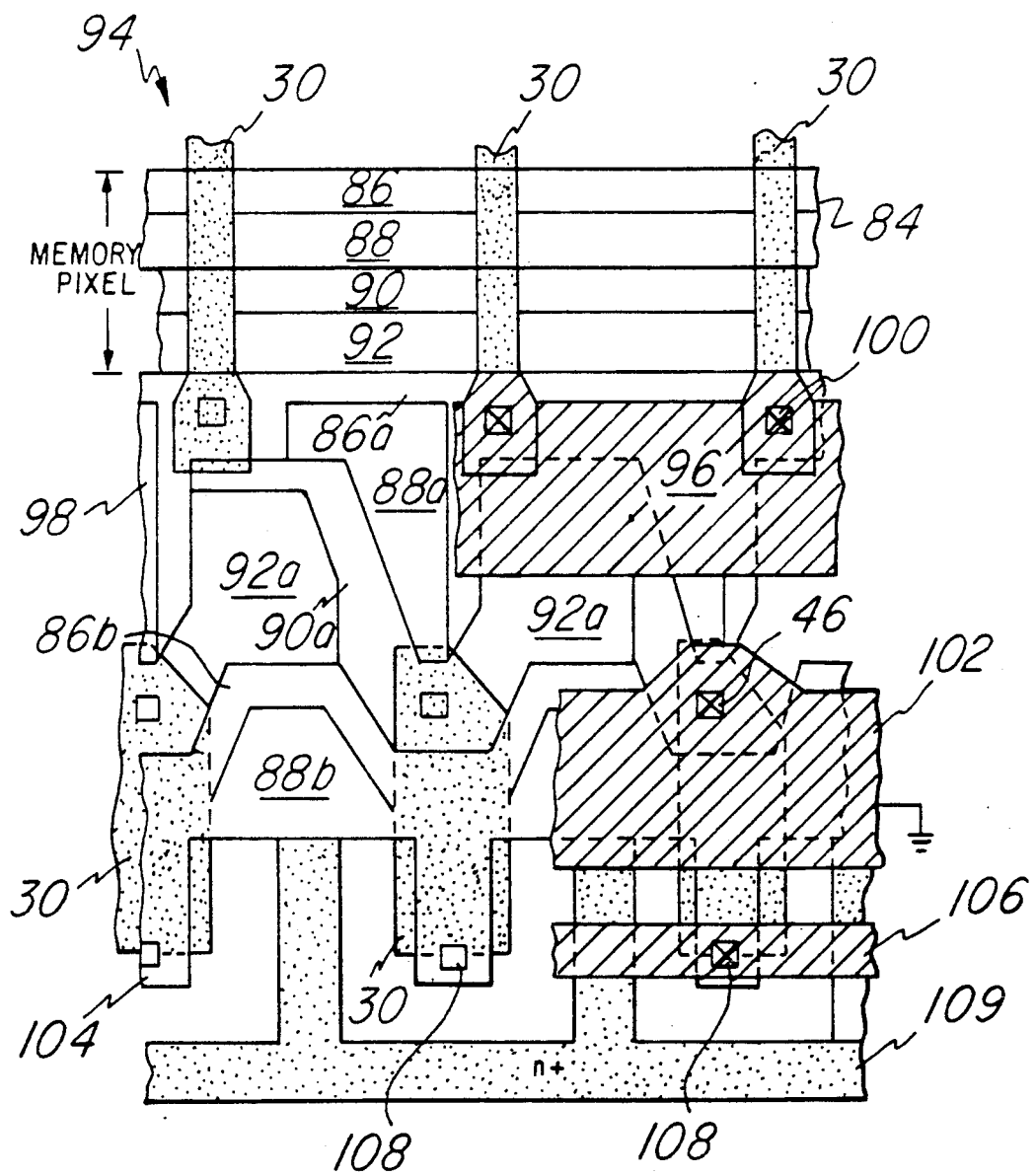
FIG. 11 is a plan view of a portion of the memory area and clearing drain of an image sensor array incorporating the present invention.

The memory serial register pixel structure with fast clearing gate and drain are illustrated in plan view in FIG. 11 as indicated generally at 94. The layout of this region of the device is largely conventional with only small modifications required due to the necessity to provide the top buss for the virtual gate. An important feature to note here is that once more the wedge shaped wells 88 and 92 are used to create fringing fields to aid the two dimensional charge transfer. The requirement for a top metal buss does not present any complications for the design and even more complex multiple register structures are possible using the first preferrd embodiment of the present invention. A clocked gate buss 96 is connected to serial register polysilicon gate 98 in regions 100. Virtual gate buss 102 carries the ground connection to the virtual gate regions through regions 46. Clearing gate 104 is coupled to clearing gate buss 106 through regions 108. The clearing drain is indicated at 109. In operation, when the clearing gate 104 is low, there can be no charge transfer vertically from well 92a to well 88b, therefore charge is transferred horizontally from right to left from region 92a to region 88a of an adjacent channel with each pulse of the serial register gate 98. In this way, charge that has entered the serial register in parallel from the memory pixels is transferred serially to the left, out of the array. If, however, clearing gate 104 is biased high, charge in well 92a will be transferred into well 88b and then immediately into charge clearing drain 109. In this mode of operation, the vertical CCD channels of the memory pixels can be cleared rapidly by transferring charge into the clearing drain 109.

For an image sensor with small pixel size, optimization of the CCD channel doping profiles is needed. The typical virtual phase CCD cell such as the one used in the serial register or the memory consists of two main regions, the clocked gate region and the virtual gate region. These two regions substantially differ in their doping profiles and, consequently, different approaches must be used for their optimization.

To increase the charge storage density of the clocked phase, it is sufficient to increase the doping concentration of the buried channel, locate the channel impurities closer to the silicon-silicon dioxide interface, and reduce the gate oxide thickness. The limiting conditions to this procedure are the maximum permissible field strength in the silicon or silicon dioxide and the minimum potential barrier required between the channel potential in the full well condition and the surface potential. An inadequate potential barrier to the interface would cause charge trapping at the surface state traps and consequently degradation of the CTE.

The virtual phase region, on the other hand, has a slightly more complicated structure with an additional optimization constraint. It is desirable that the p+ doping of the virtual gate region be as shallow as possible. This is determined by the physical properties of the dopants used and the necessary heat treatments encountered during the course of subsequent processing. There is a minimum junction depth determined by the required p+ impurity dose which cannot be further reduced. The channel charge storage density in this region again depends upon the buried channel doping and on the impurity distance to the virtual gate. The limit is once more the maximum permissible field strength in silicon.

Figure 12B:
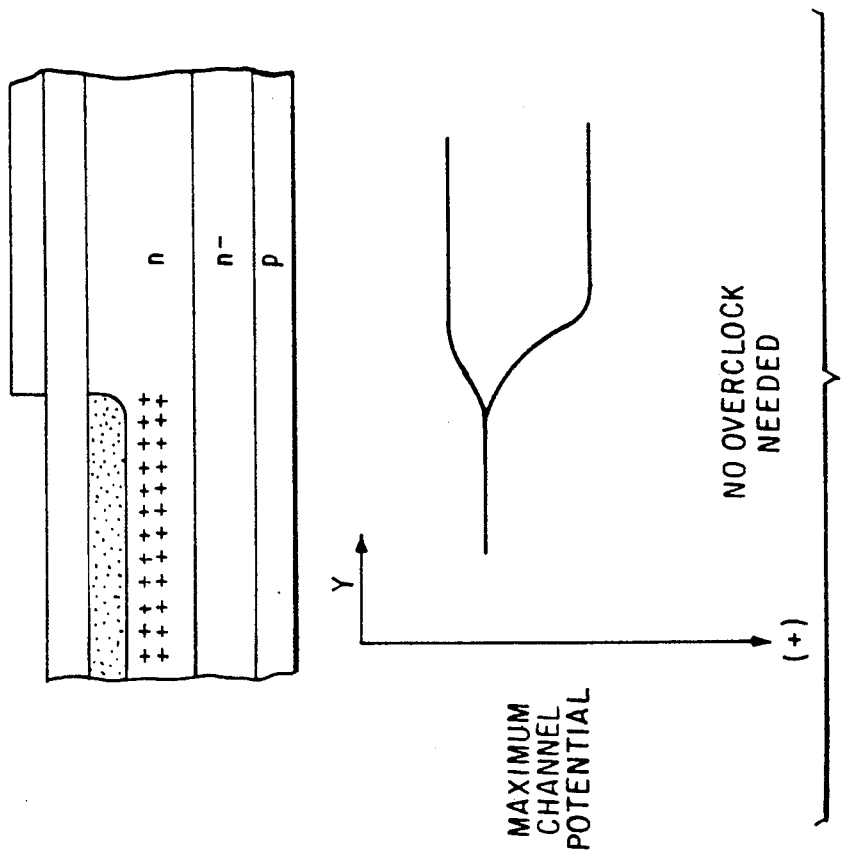
FIG. 12b is a cross-sectional view and corresponding channel potential profile of the channel doping profile used in the image sensor array of the present invention.
Figure 12A:
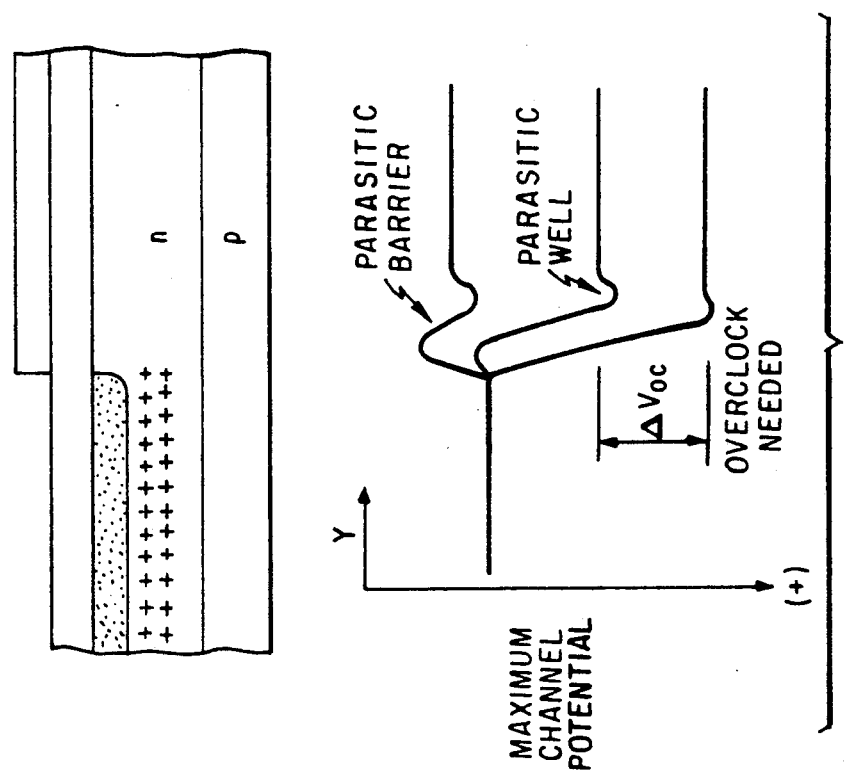
FIG. 12a is a cross-sectional view and corresponding channel potential profile of a prior art channel doping profile.

A difficult problem encountered in the previous virtual phase devices was the potential profile at the interface between the clocked gate and virtual gate regions. Due to the different depths of the buried channel in each of the regions and due to the two dimensional effect of the p+ gate, parasitic potential wells frequently formed at these interfaces if no countermeasures were taken. This is illustrated in FIG. 12. It has been found experimentally as well as by two dimensional numerical calculations that this problem is completely eliminated by using a suitable doping profile for the buried channel. The buried channel used in the device of the present invention is formed by two different impurity profiles. The first has a low concentration and extends deep into the bulk, while the second has a high concentration and is located close to the silicon surface. The highly doped portion of the impurity profile provides the necessary high charge storage density, while the low dose impurity profile extending into the bulk causes the potential maximum to shift from near the surface to deep into the bulk when the gate is clocked negative. As a result of this profiled buried channel doping, charge is now transferred from pixel to pixel in a more complicated way. It flows first from the near surface region to deeper into the bulk and then laterally into the virtual gate region. There is now a smooth potential transition from one region to the other without any parasitic potential wells with strong lateral fringing fields that significantly improve the CTE.

The smaller the pixel size of an image array, the lower the sensitivity of the device and, consequently, the less charge that will accumulate in the photosite well. In order to minimize the impact of this undesirable effect on the image array performance it is necessary to improve the noise floor and the sensitivity of the charge conversion amplifier which receives a charge packet from the array and converts it into current.

Figure 13:
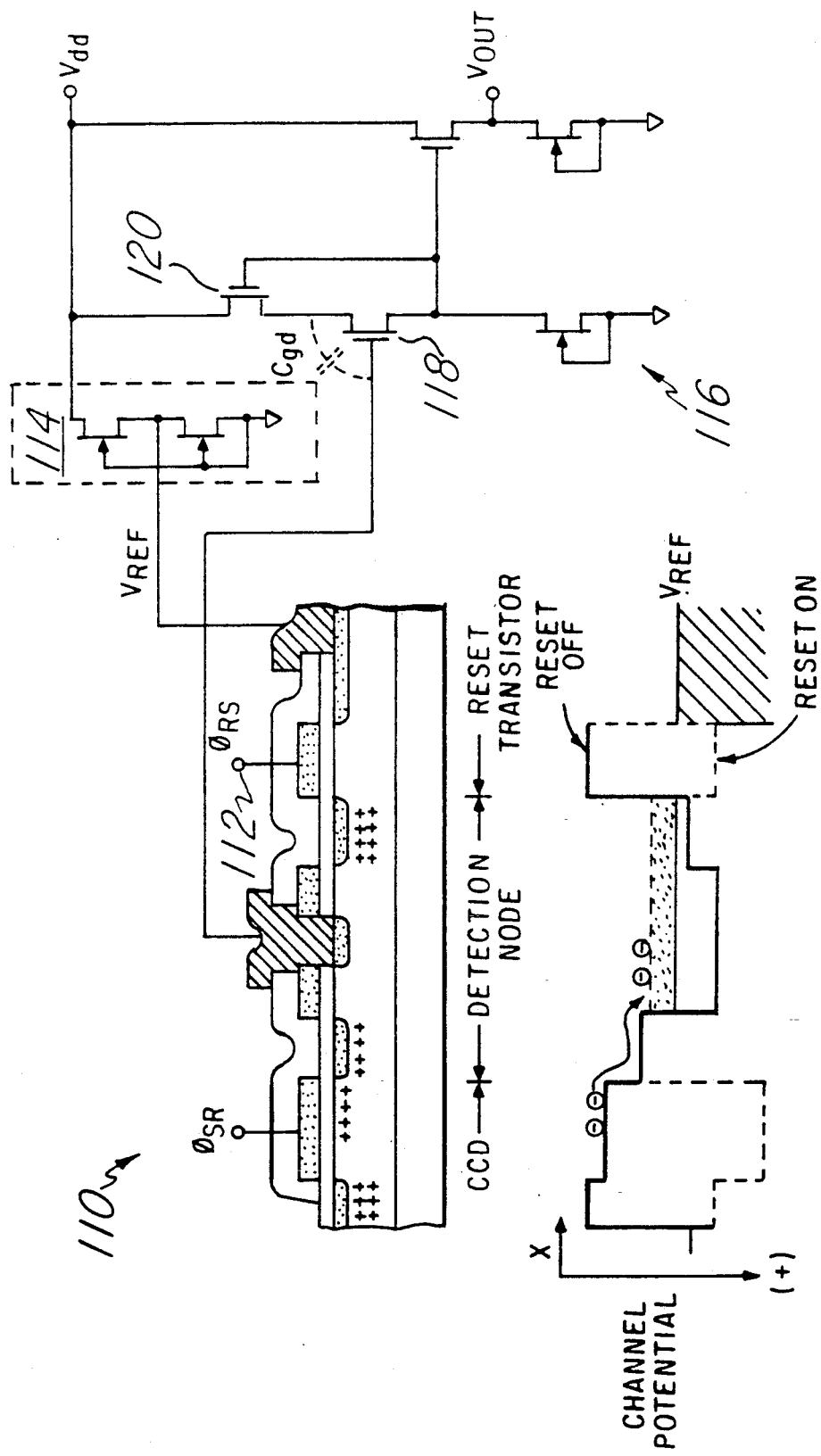
FIG. 13 is a cross-sectional view and corresponding channel potential diagram of a charge detection node of the image sensor array of the present invention as well as a schematic diagram of a charge conversion amplifier of the present invention.

FIG. 13 shows a cross-sectional view of a conventional charge detection node and a corresponding channel potential diagram, indicated generally at 110. The charge detection node 110 is a conventional gated floating diffusion structure typically used with virtual phase CCDs and has an externally driven reset gate 112. A reference voltage generator 114 is built on-chip using junction FET transistors which automatically track the channel potential in the detection node 110. When reset gate 112 is pulsed, the reference voltage $V_{ref}$ is applied to the detection node to reset it to a nominal level.

Also shown in FIG. 13 is an amplifier circuit, indicated generally at 116, which utilizes a cascode configuration of MOS transistors 118 and 120 in its first stage. This approach minimizes the parasitic capacitance $C_{gd}$ from the gate to the drain of a conventional circuit by taking advantage of the Miller feedback effect. The resulting lower parasitic loading of the detection node 110 thus contributes to improved charge conversion gain and consequently to a lower electron equivalent noise floor. The first stage transistor dimensions are selected such that the resulting amplifier 116 input capacitance matches the detection node 110 capacitance to obtain an optimum performance for the anticipated correlated double sampling (CDS) operation. The second stage transistor dimensions have been optimized for the required load driving capability and a lowest power consumption at the given clocking frequency.

Figure 14:
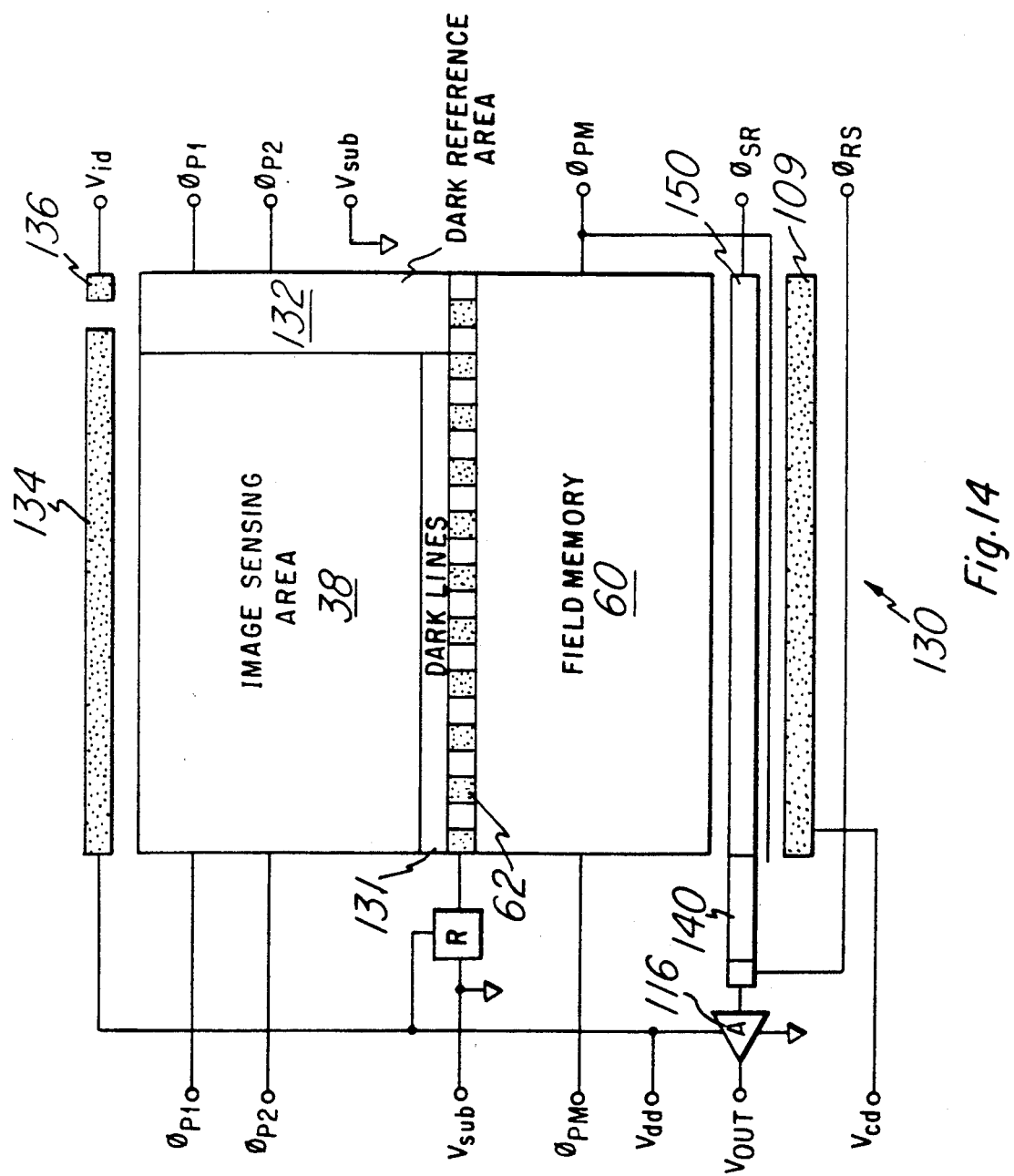
FIG. 14 is a schematic block diagram of the organization of the various parts of an image sensor array incorporating the present invention.

A schematic block diagram representation of the basic sensor system architecture for a top buss FIT device is depicted generally at 130 in FIG. 14 and incorporates the structures of FIGS. 3, 6, 11 and 13. The sensor 130 consists primarily of two large blocks, the image sensing area 38 and the field memory area 60, the functioning of which has been described in detail hereinabove. The serial register 150 receives charge in parallel from field memory 60 and shifts it serially into the charge detection amplifier 116.

In a preferred embodiment, the image sensing area 38 is composed of 490 lines from which 486 are active and 4 are covered by a light shield. The dark lines 131 are located at the edge of the image sensing area 38 which interfaces with the field memory 60, in order to provide isolation between the two regions. Each line has a total of 684 pixels from which 668 are active and 16 are shielded by a light shield. The dark pixels are located at the right edge of the image sensing area 38 in the dark reference area 132, the operation of which is described hereinbelow. The image sensing area 38 is guarded against the leakage of carriers generated at the periphery by a drain 134 at the top and by two dummy columns at each edge (not shown). The dummy columns empty their charge into the antiblooming drains 62 located at the interface between the image sensing area 38 and the field memory 60 as described above in relation to FIG. 6. There is also an input diode 136 located at the top edge of the image sensing area 38 which enables a fixed amount of charge to be input into the last dark reference column. This feature is important for the automated testing of the sensor 130.

The field memory 60 of the virtual phase FIT image sensor 130 consists of 245 lines with 684 pixels in each line. Two buffer columns are incorporated on each side of the memory 60 for protection against the leakage of the peripheral charge, and are clocked in a reverse direction into the same anitblooming drains 62 as the image area 38 buffer columns.

The signal from the memory 60 is transferred in parallel into the single serial register 150. Charge in this register 150 can be either transported serially into the amplifier 116 or emptied through the clearing gate 104 into the charge clearing drain 109. The amplifier 116 receives charge from the serial register 150 through an additional 18 dummy pixels 140 which span the necessary distance from the edge of the memory 60. The dummy pixels 140 are used for storing the dark reference signal generated at the right edge of the image sensing area in region 132 and do not, therefore, interface with the charge clearing drain 109. The dark reference signal is utilized in the signal processing circuits of the output signal once it has left the image sensor 130 in a manner that is known in the art.

Figure 15:
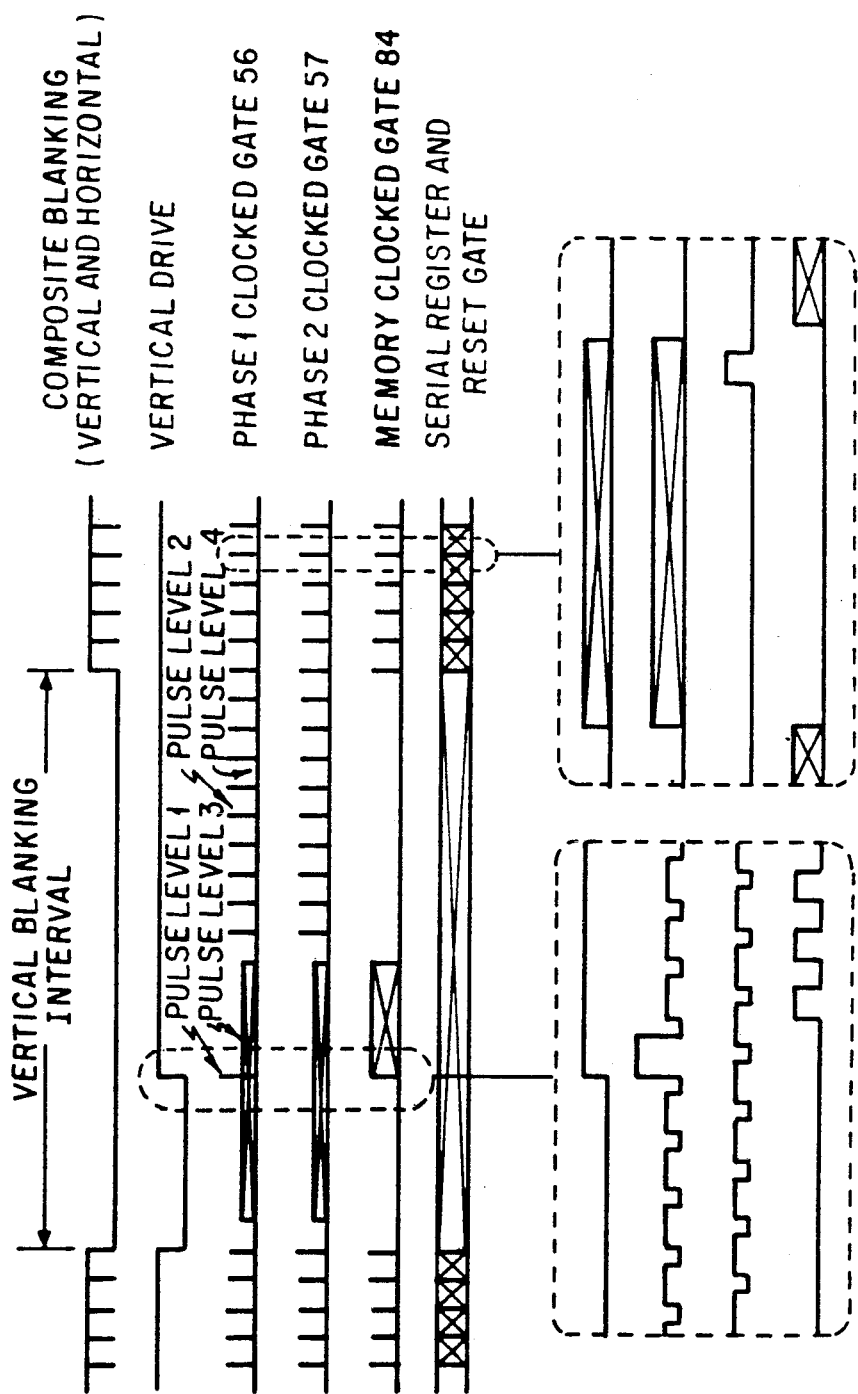
FIG. 15 is a timing diagram illustrating the various clocking signals required to operate the image sensor array incorporating the present invention.

A timing diagram for clocking of the image sensor architecture of FIG. 14 is shown in FIG. 15. During the vertical blanking period, and synchronized to the vertical drive signal, a pulse, designated as "level 1" in FIG. 15, is applied to phase 1 clocked gate 56. The level 1 pulse is of sufficient magnitude to cause a transfer of charge from the photosites 40 into the vertical CCD channel in the phase 1 regions. After the completion of the level 1 pulse, the photosites 40 under the phase 1 region resume integration of charge. The charge in the vertical CCD register is then clocked into the memory by the chain of "level 3" pulses on the phase 1 clocked gate 56 and the pulses on the memory clocked gate 84. At the end of these pulse trains, the charge from the photosites 40 in the phase 1 regions has been completely transferred to the memory 60. After this, a series of "level 2" pulses, which are higher than a level 3 pulse, but not as large as a level 1 pulse, are applied to the phase 1 clocked gate 56 and the phase 2 clocked gate 57 in order to transfer any overflow charge into the antiblooming drain 62. After the end of the vertical blanking interval, a series of horizontal blanking intervals occur, during which a single pulse of the memory gate 84 shifts charge in parallel into the serial register 150. A series of pulses on the serial register gate 98 then shift the charge serially out of the image sensor. During the next vertical blanking period, the entire sequence is repeated with the phase 2 clocked gate 57.

Charge transfer from the selected photosites 40 to the vertical CCD column is accomplished by momentarily increasing the amplitude of the corresponding gate above its nominal high clocking level. The photosite transfer barrier 48 of FIG. 3 has a higher threshold than the vertical transfer barrier 50 which allows the charge to be clocked down the vertical CCD channel at the same time that charge is confined in the photosite 40 by the transfer barrier 48. By choosing which of the clocked gates 56 and 57 the transfer pulse will be applied, it is possible to choose the photosites 40 from which charge will be transferred. This flexibility allows for operation of the sensor 130 in several useful modes.

The standard TV interlace operation with 1/60 second integration time is accomplished by transferring the signal from all photosites 40 into the vertical CCD channels in each TV field. This is then followed by summing charge under the phase 1 clocked gate 56 with charge under the phase 2 clocked gate 57 in the first TV field, and charge under the phase 2 clocked gate 57 with charge under the phase 1 clocked gate 56 in the second TV field. Each time, only 245 lines of data are created and transferred into memory.

The vertical CCD channel is clocked in a fashion similar to the standard two phase CCD. The clock pulses $\phi_{P1}$ and $\phi_{P2}$ applied to the clocked gates 56 and 57, respectively, must have overlapping timing as shown in the detail of FIG. 15. This follows from the fact that there are no virtual wells present in the vertical CCD channel and charge transfers from the clocked well 54 of phase 1 directly to the clocked well 54 of phase 2. The virtual barrier 42 is used only to separate the polysilicon gates 56 and 57 of neighboring lines and does not store charge.

A modification of the standard interlace operation results in the signal from only 245 lines of photosites 40 being selected and transferred into the memory 60 as described above. The integration time now becomes 1/30 second and in this mode of operation the vertical resolution is improved. The drawback, however, is an objectionable discontinuity in motion during a quick camera movement or in scenes with fast moving objects.

An electronic shutter feature may also be implemented in the device of FIG. 14. In this cae, the photosite transfer pulses (level 1 pulses) are continuously applied to both clocked phase gates 56 and 57 up to a certain selected moment during the charge integration period to constantly clear them. The reduced signal is then integrated only for the duration of the remaining portion of the integration period and transferred into the memory 60. The clear pulses are applied to the clocked gates 56 and 57 only during the horizontal blanking intervals to avoid interference with the active video signal.

The vertical CCD channels in the device of FIG. 14 thus serve multiple purposes. They are used for transferring the desired signal into the memory 60, for draining the overflow charge from the photosites 40, and also as drains for charge clearing during the electronic shutter operation. This multiple use, however, creates a small complicaton in the clocking of the gates 56 and 57. Since the vertical CCD channels serve as antiblooming drains, it is necessary to clear them completely of any residual charge prior to transferring the valid signal from the photosites 40. During this period it is necessary to use another high clock level bias for the gates 56 and 57 that momentarily blocks transfer of the overflowing charge from the overloaded photosites 40. If this is not done, overflowing charge from the overloaded photosites 40 would cause an image smear. The clocking of the vertical CCD channel is thus more complex with four different levels of clocking signals. The details of all of the important clocking signals for the memory 60 and the serial register 150 are given in the timing chart of FIG. 15.

A few preferred embodiments have been described in detail hereinabove. It is to be understood that the scope of the invention also comprehends embodiments different from those described, yet within the scope of the claims.

For example,

Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is therefore intended that the appended claims encompass any such modifications or embodiments.

What is claimed is:

1. A method for fabricating a virtual phase image sensor comprising the steps of:
   forming a semiconductor substrate of a first conductivity type;
   forming a buried channel region of a second conductivity type in said substrate;
   forming a virtual gate of said first conductivity type at a surface of said buried channel region;
   implanting at least one channel stop region of said first conductivity type in said virtual gate, said at least one channel stop region contacting said buried channel; and
   forming at least one conductive contact on an upper surface of said at least one channel stop wherein said at least one conductive contact is additionally coupled to said substrate.

2. The method of claim 1 wherein said buried channel region is not continuous.

3. The method of claim 1 further comprising the step of doping said buried channel region to have a higher doping near an interface between said buried channel region and said virtual gate.

4. The method of claim 1 wherein said forming at least one conductive contact step comprises making said substrate coupling at a periphery of said image sensor.

5. A method for fabricating a virtual phase image sensor comprising the steps of:
   forming a semiconductor substrate of a first conductivity type;
   forming a buried channel region of a second conductivity type;
   forming a gate insulator layer on said buried channel;
   selectively forming at least one conductive gate region on said gate insulator;
   depositing and patterning a masking layer on said at least one conductive gate and said gate insulator such that a portion of an edge of said at least one conductive gate is exposed by said masking layer pattern; and
   implanting at least one channel stop region of said first conductivity type in said buried channel in areas exposed by said masking layer pattern, whereby at least one side of said at least one channel stop region is self-aligned to said portion of an edge of said at least one conductive gate.

6. The method of claim 5 further comprising the step of forming at least one conductive contact on an upper surface of said at least one channel stop wherein said at least one conductive contact is additionally coupled to said substrate.

7. The method of claim 5 wherein said buried channel region is not continuous.

8. The method of claim 5 further comprising the step of doping said buried channel region to have a higher doping near an interface between said buried channel region and said virtual gate.

9. The method of claim 6 wherein said forming at least one conductive contact step comprises making said substrate coupling at a periphery of said image sensor.

* * * * *

UNITED STATES PATENT AND TRADEMARK OFFICE
CERTIFICATE OF CORRECTION

PATENT NO.   : 5,151,380

DATED        : 9/29/92

INVENTOR(S)  : Jaroslav Hynecek

Page 1 of 2

Figure 1:
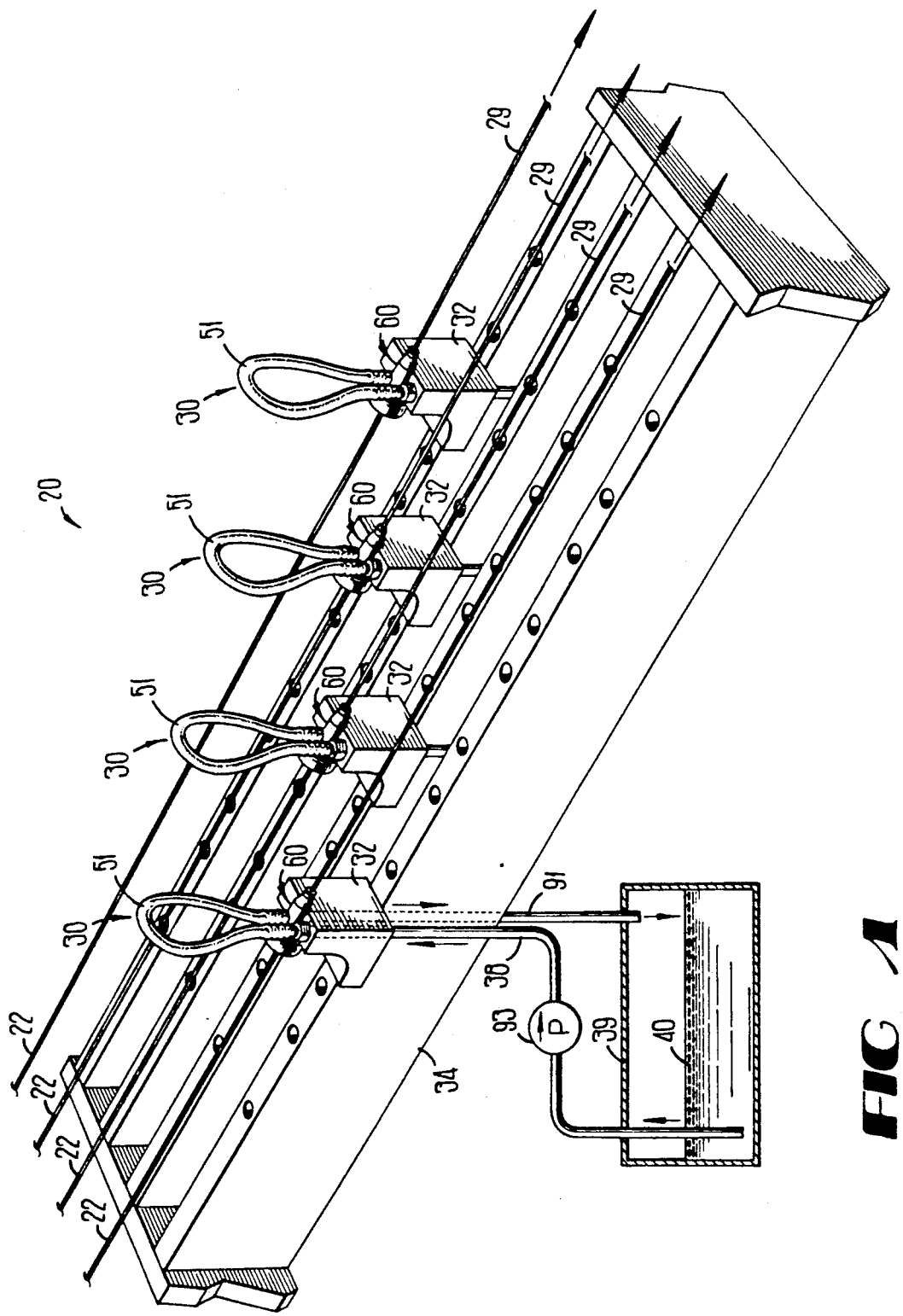
FIG. 1 is a cross-sectional view of a prior art CCD imager cell.

It is certified that error appears in the above-indentified patent and that said Letters Patent is hereby corrected as shown below:

In the drawings, sheet 1 consisting of Fig. 1, should be deleted to be replaced with the corrected sheet 1 consisting of Figs. 1, 2a and 2b, as shown on the attached page.

Signed and Sealed this

Eleventh Day of January, 1994

*Attest:*

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,151,380
DATED : 09/29/92
INVENTOR(S) : Jaroslav Hynecek

It is certified that error appears in the above-identified patent and that said Letters Patent is hereby corrected as shown below:

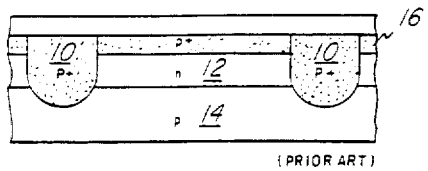

(PRIOR ART)

Fig. 1

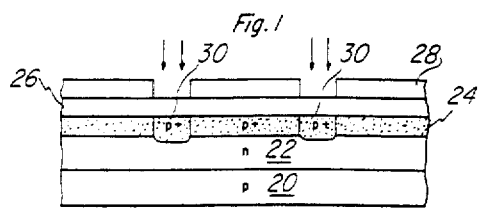

Fig. 2a

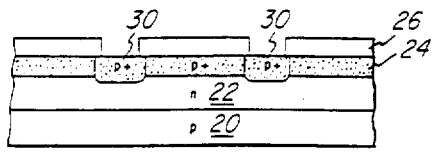

Fig. 2b